(12) United States Patent
Iwakiri

(10) Patent No.: US 6,828,659 B2
(45) Date of Patent: Dec. 7, 2004

(54) SEMICONDUCTOR DEVICE HAVING A DIE PAD SUPPORTED BY A DIE PAD SUPPORTER

(75) Inventor: Toshihiko Iwakiri, Miyazaki (JP)

(73) Assignee: Oki Electric Industry Co., Ltd., Tokyo (JP)

(*) Notice: Subject to any disclaimer, the term of this patent is extended or adjusted under 35 U.S.C. 154(b) by 68 days.

(21) Appl. No.: 09/866,920

(22) Filed: May 30, 2001

(65) Prior Publication Data

US 2002/0027270 A1 Mar. 7, 2002

(30) Foreign Application Priority Data

May 31, 2000 (JP) ........................................ 2000-161929

(51) Int. Cl.[7] .............................................. H01L 23/495
(52) U.S. Cl. ....................... 257/666; 257/669; 257/670; 257/676
(58) Field of Search ................................ 257/666, 667, 257/669, 670, 674, 676

(56) References Cited

U.S. PATENT DOCUMENTS

| | | | | |
|---|---|---|---|---|
| 4,109,096 A | * | 8/1978 | Dehaine .................... | 174/68.5 |
| 4,331,740 A | * | 5/1982 | Burns .......................... | 428/572 |
| 4,413,404 A | * | 11/1983 | Burns .......................... | 29/590 |
| 5,637,913 A | * | 6/1997 | Kajijara et al. ............. | 257/666 |
| 5,661,338 A | * | 8/1997 | Yoo et al. .................... | 257/676 |
| 5,949,132 A | * | 9/1999 | Libres et al. ............... | 257/666 |
| 5,952,711 A | * | 9/1999 | Wohlin et al. .............. | 257/668 |
| 6,072,230 A | * | 6/2000 | Carter, Jr. et al. .......... | 257/666 |
| 6,153,922 A | * | 11/2000 | Sugiyama et al. .......... | 257/666 |
| 6,208,017 B1 | * | 3/2001 | Kurihara ..................... | 257/666 |
| 6,211,565 B1 | * | 4/2001 | Yu .............................. | 257/691 |
| 6,281,566 B1 | * | 8/2001 | Magni ........................ | 257/666 |
| 6,320,270 B1 | * | 11/2001 | Muto et al. ................. | 257/787 |
| 6,329,715 B1 | * | 12/2001 | Hayashi ...................... | 257/724 |
| 6,340,837 B1 | * | 1/2002 | Miyaki et al. ............. | 257/666 |
| 6,400,569 B1 | * | 6/2002 | Auer ........................... | 361/704 |
| 6,455,922 B1 | | 9/2002 | Arguelles et al. | |

FOREIGN PATENT DOCUMENTS

| | | |
|---|---|---|
| JP | 6-216303 | 8/1994 |
| JP | 9-64266 | 3/1997 |
| JP | 11-224930 | 8/1999 |
| JP | 11-284121 | 10/1999 |
| JP | 2001-24132 | 1/2001 |

* cited by examiner

Primary Examiner—David A. Zarneke
Assistant Examiner—Asok Kumar Sarkar
(74) Attorney, Agent, or Firm—Volentine Francos & Whitt, PLLC

(57) ABSTRACT

A semiconductor package includes a semiconductor chip which is mounted on a die pad which is smaller than the semiconductor chip, a die pad supporter which supports the die pad, the die pad supporter having a stress absorbing portion, the stress absorbing portion is disposed under the semiconductor chip.

10 Claims, 6 Drawing Sheets

SEMICONDUCTOR DEVICE HAVING A DIE PAD SUPPORTED BY A DIE PAD SUPPORTER

The present application claims priority under 35 U.S.C §119 to Japanese Application No. 2000-161929 filed on May 31, 2000, which is hereby incorporated by reference in its entirely for all purposes.

BACKGROUND OF THE INVENTION

1. Field of the Invention

The present invention relates to a semiconductor device, and particularly to a semiconductor device having a die pad and to a semiconductor chip mounted on the die pad.

2. Description of the Related Art

A conventional semiconductor package is described in Japanese Laid-Open Patent No. 216303/1994 published on Aug. 5, 1994. The document describes that a resin which covers a semiconductor chip occasionally peel away from a die pad which supports the semiconductor chip thereon, by a stress applied to the semiconductor device. The document describes that the die pad is formed to be smaller than a semiconductor chip to avoid the such peeling between the resin and the die pad.

However, in such semiconductor device, a die pad supporter which supports the die pad is expanded by a stress applied thereto in a wire bonding process. In a method for fabricating the semiconductor device, a semiconductor chip is mounted on the die pad which is a part of a leadframe. Then, the leadframe is set on a heat stage. After setting the leadframe on the heat stage, the leadframe is connected to the semiconductor chip through a wire in the wire bonding process. During the wire bonding process, the heat stage continues to heat the leadframe. The die pad supporter expands by thermal expansion during the wire bonding process, the die pad moves up from an initial position. If the die pad moves up from the initial position, the semiconductor chip or the wire may be exposed from the surface of the molding resin.

SUMMARY OF THE INVENTION

An object of the present invention to provide a semiconductor package which is capable of decreasing the displacement of the die pad.

To achieve the object, according to the present invention includes a semiconductor chip which is mounted on a die pad which is smaller than the semiconductor chip, a die pad supporter which supports the die pad, the die pad supporter having a stress absorbing portion and the stress absorbing portion which is disposed under the semiconductor chip.

According to the present invention, a changing of the die pad supporter causing a stress of the die pad supporter by the thermal expansion can be reduced.

Typical ones of various inventions of the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects, features and advantages thereof will be better understood from the following description taken in connection with the accompanying drawings in which:

DETAILED DESCRIPTION OF PREFERRED EMBODIMENTS

Figure 1:
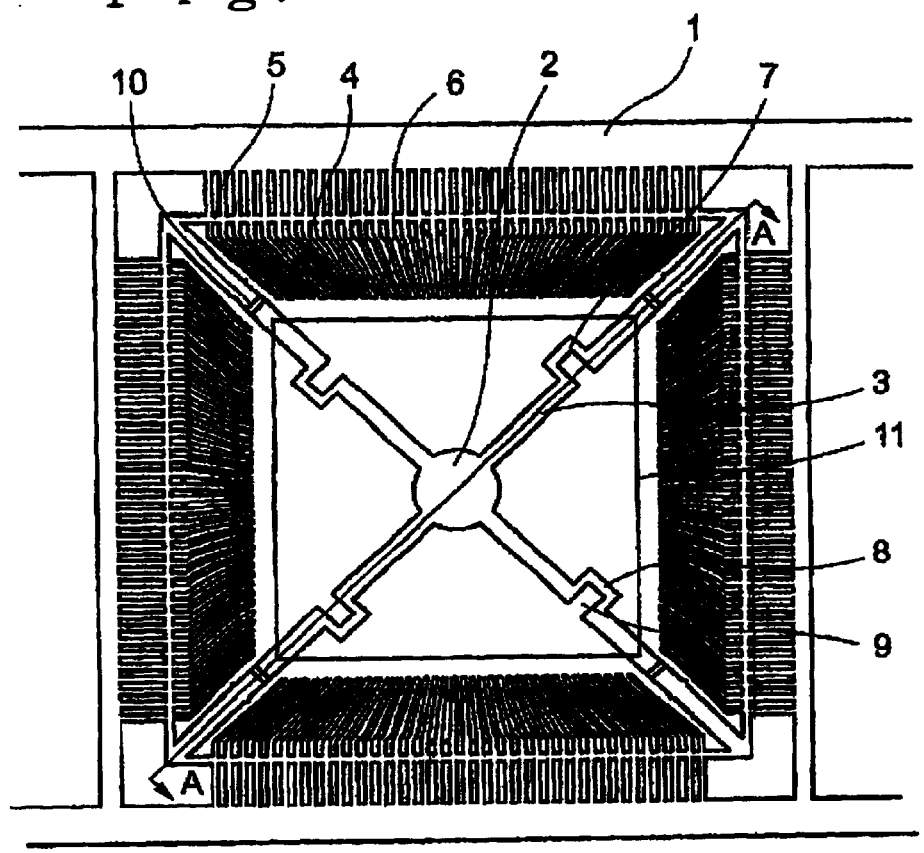
FIG. 1 is a plan view showing a lead frame of a semiconductor package according to first preferred embodiment of the present invention.
Figure 2:
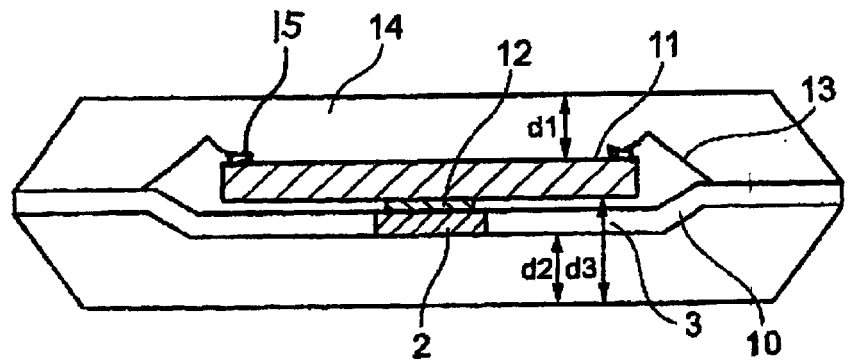
FIG. 2 is a cross section at a portion of line A–A' shown in FIG. 1.

Preferred embodiments of the present invention will hereinafter be described with reference to the accompanying drawings. FIG. 1 is a plan view showing a leadframe of the first embodiment of the present invention. FIG. 2 is the cross section at a portion along line A–A' shown in FIG. 1.

As shown in FIG. 1, a die pad 2 is formed at a central of a leadframe 1. Four die pad supporters 3 support the die pad 2. The die pad supporters are located at right angles from each other. A size of the die pad 2 is smaller than the size of a semiconductor chip 11. That is, a configuration of the die pad 2 is smaller than that of the semiconductor chip.

A plurality of inner leads 4 are located in the vicinity of the die pad 2 along four sides of the die pad 2. That is, the inner leads 4 surround the die pad 2. The inner leads 4 are supported with a dam bar 5. The dam bar 5 prevents an outflow of a resin in a resin molding process described hereinafter. Edges of the inner leads 4 are plated with silver.

Each of the die pad supporters 3 has a stress-absorbing portion 7. The stress-absorbing portion 7 has a function for absorbing a stress applied to the die pad 2, when the die pad supporters 3 are expanded by thermal expansion. Each of the stress-absorbing portions 7 is located between the die pad 2 and the end of the inner leads 4. The configuration of the stress-absorbing portion has a protruding portion 8 and a concave portion 9, which are formed in a part of the die pad supporters 3. The stress-absorbing portions 7 are capable of absorbing the thermal expansion of the die pad supporters 3, such as a spring.

A thin film of 42-alloy or copper is pressed or etched for forming the die pad 2, the die pad supporter 3 and the inner leads 4. The stress-absorbing portions 7 are simultaneously formed in the pressing step or the etching step. As a result, the stress-absorbing portions 7 and the die pad supporter 3 belong in the same plane.

Each of the die pad supporters 3 is located between a corresponding pair of inner leads 4, and are parallel with the corresponding pair of inner leads 4. Each of the die pad supporters 3 has a down-set portion 10 which is located at an area between the pair of inner leads 4. As a result, the die pad 2 is set lower than a level of the inner lead 4. Such structure is often called a down-set structure.

A semiconductor chip 11 is mounted on the die pad 2. As shown in FIG. 2, the semiconductor chip 11 is fixed on the die pad 2 by an adhesive 12. The adhesive 12 is a silver paste. Also, the semiconductor chip 11 is located on the stress-absorbing portions 7. The adhesive is not formed on the stress-absorbing portions 7 so as to use the stress-absorbing portions as a spring.

Figure 8:
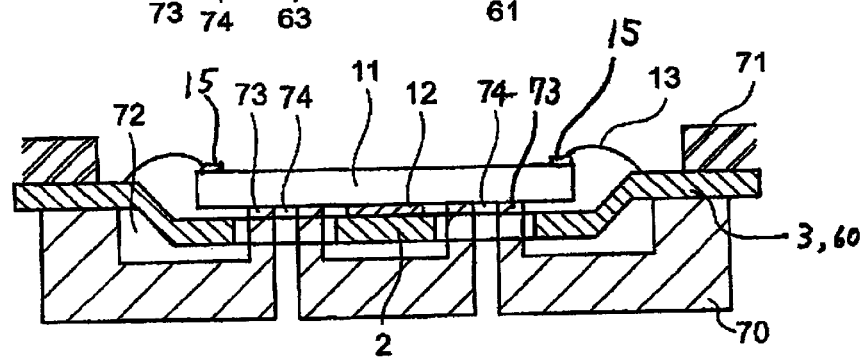
FIG. 8 is a cross section showing the wire bonding step at a portion of lines A–A' shown in FIG. 1 and FIG. 7.

After the semiconductor chip 11 is fixed on the die pad 2, electrode pads 15 arranged on a surface of the semiconductor chip 11 are connected to the inner leads through wires 13. During a wire-bonding step, the leadframe 1 is clamped on the heat stage 70 by a damper 71, as shown in FIG. 8. A rear surface of the semiconductor chip 11 is vacuumed by a vacuuming portion 73 for holding the semiconductor chip 11 on the heat stage, as also shown in FIG. 8.

Then, an area surrounded by the dam bar 5 is molded with a molding resin 14. As a result, a distance d1 between a top surface of the semiconductor chip 11 and a top surface of the molding resin 14 is substantially equal to a distance d3 between a rear surface of the semiconductor chip 11 and a rear surface of the molding resin. In the conventional semiconductor device including a die pad larger than a semiconductor chip mentioned above, the distance d1 is substantially equal to a distance d2 between the rear surface of the semiconductor chip 11 and the rear surface of the molding resin 14. In the case where a size of the die pad 2 reduces, a ratio of the semiconductor chip to the molding resin 7 increases. In such case, in a flow of the resin while the resin molding step and in contraction stress while the resin is congealed, an influence of the semiconductor chip 11 is increased. In the case where the die pad 2 smaller than the semiconductor chip 11 is used, the semiconductor device 11 is set at a suitable portion where is in the middle level of the molding resin 14.

For example, the leadframe 1 used in the first preferred embodiment is formed by the pressing machining or the etching technique. However, it is difficult to use such technique for a semiconductor device having a number of the inner leads which are arranged at fine intervals, because of the margin of the pressing process or the etching process. In the first embodiment, as the stress absorbing portions 7 are located between the edges of the inner leads 4 and the die pad 2, therefor, a distance between the inner leads 4 does not become narrower.

Further, one press mold can be shared for forming a die pad and an inner leads of various type of a semiconductor device. Naturally, ends of the inner leads are cut in accordance with a size of a semiconductor chip of such semiconductor device by a cutting press mold.

Therefore, that enables to fabricate various types of leadframes by combining just one press mold with a suitable cutting press mold. In this case, stress-absorbing portions 7 are located between the die pad 2 and the end of the inner leads 4. The end of the inner leads 4 is located near the semiconductor chip 11 for shortening a length of the wire. The stress-absorbing portions 7 are located under the semiconductor chip 11.

Figure 3:
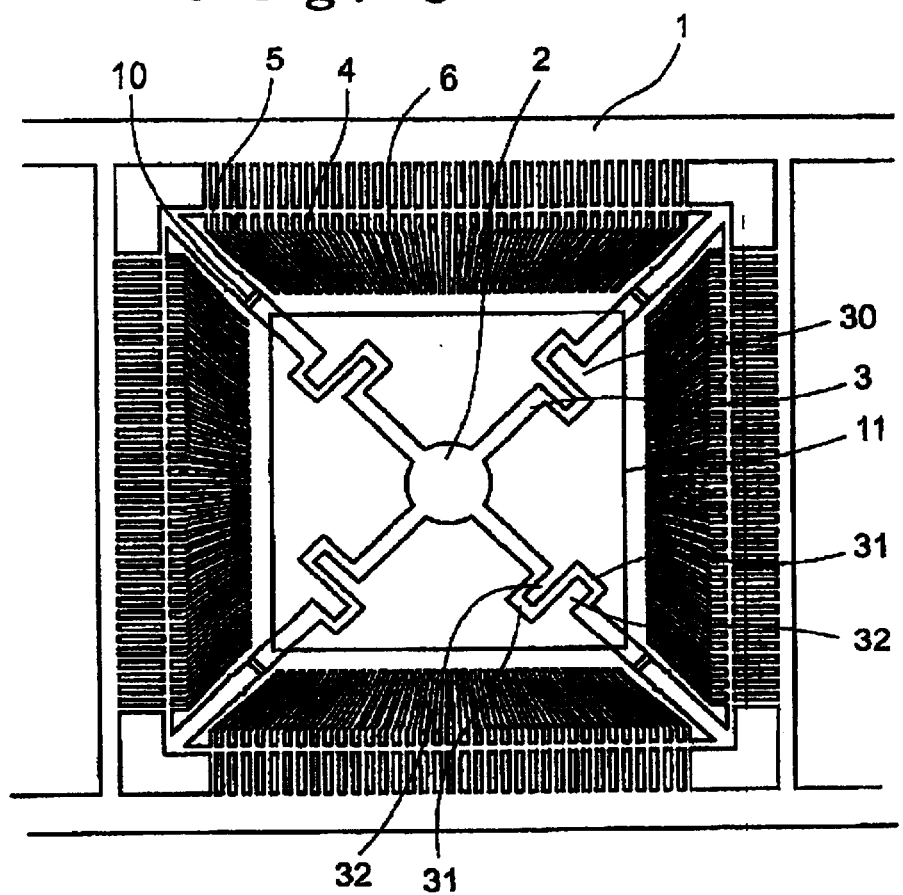
FIG. 3 is a plan view showing a first variation according to the first preferred embodiment.

Also, a configuration of the stress-absorbing portions 7 can be S-shaped stress-absorbing portions 30, as shown in FIG. 3. In this case, as a protruding portion 31 is symmetrical with a concave portion 32, a changing in lateral or vertical directions of the die pad supporters 3 causing the expansion of die pad supporter 3 can be reduced.

Figure 4:
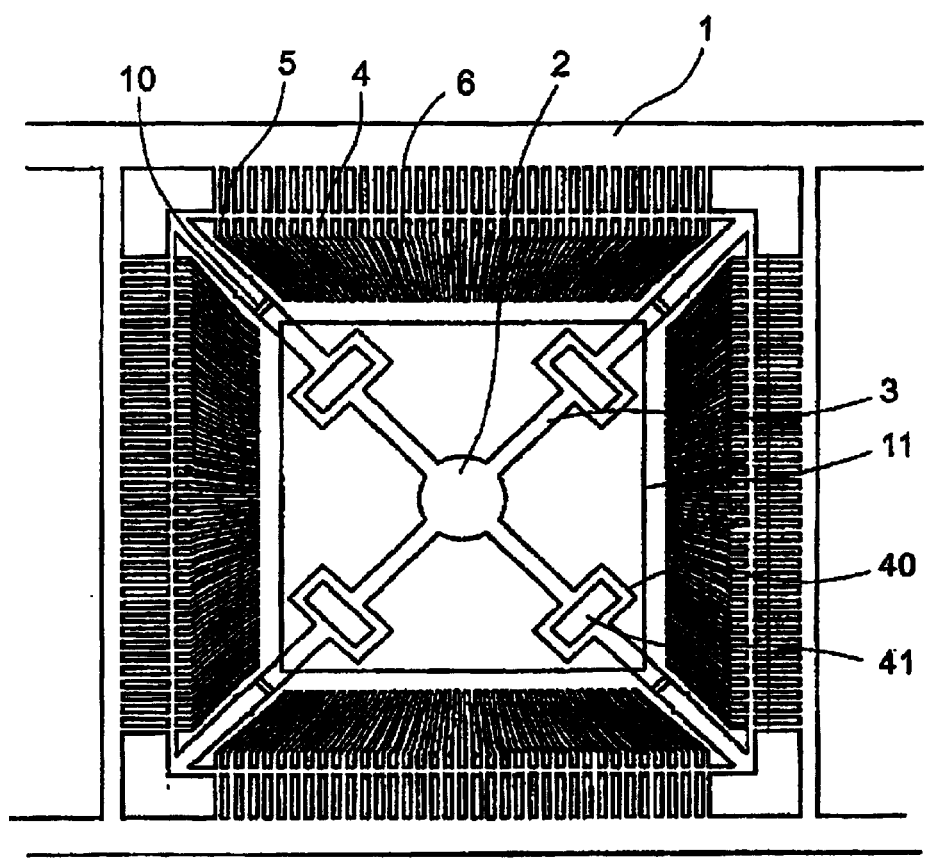
FIG. 4 is a plan view showing a second variation according to the first preferred embodiment.

Also, FIG. 4 shows other configuration of a stress-absorbing portions 40. As shown in FIG. 4, a hole 41 is formed in each die pad supporters 3 as the stress-absorbing portion. The hole is formed at a portion of the die pad supporter between the end of the inner leads 4 and the die pad 2. The portion of the die pad supporter corresponding to the hole 41 is wider than the other portion of the die pad supporter 3.

Figure 5:
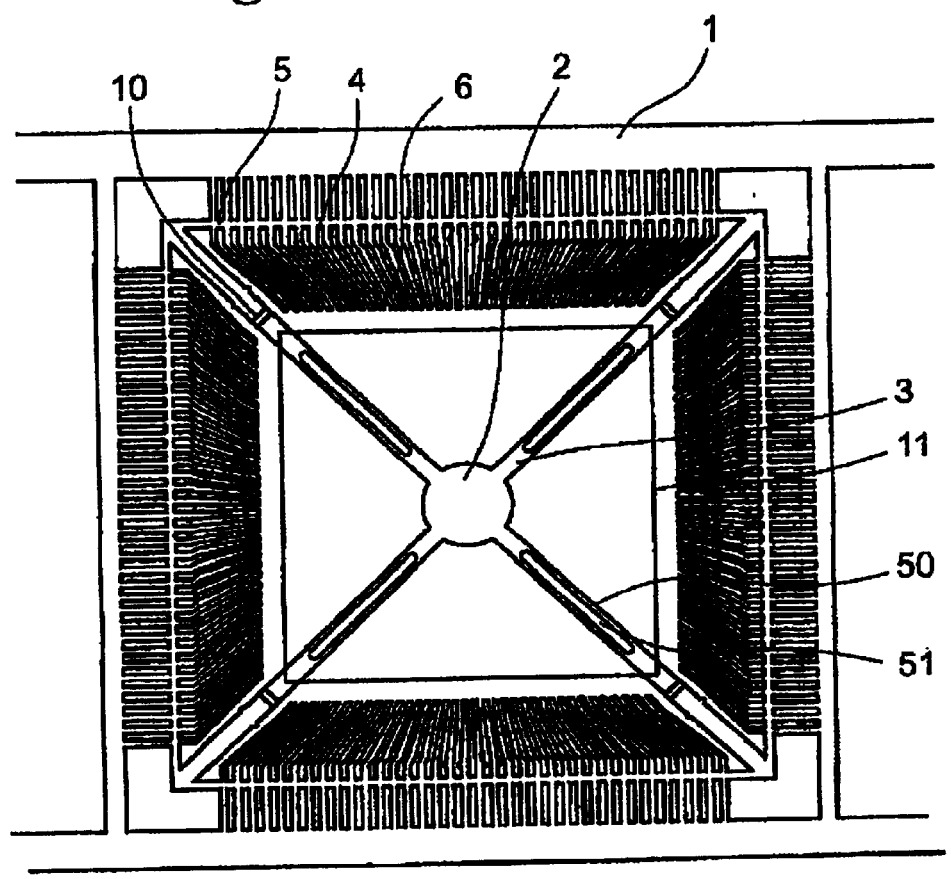
FIG. 5 is a plan view showing a third variation according to the first preferred embodiment;.

FIG. 5 shows other configuration of a stress absorbing portions 50. As shown in FIG. 5, a slit 51 is formed in each die pad supporters 3 as the stress-absorbing portion. A width of the die pad supporter portion corresponding to the slit has the same width of the other portion of the die pad supporter 3.

Figure 6:
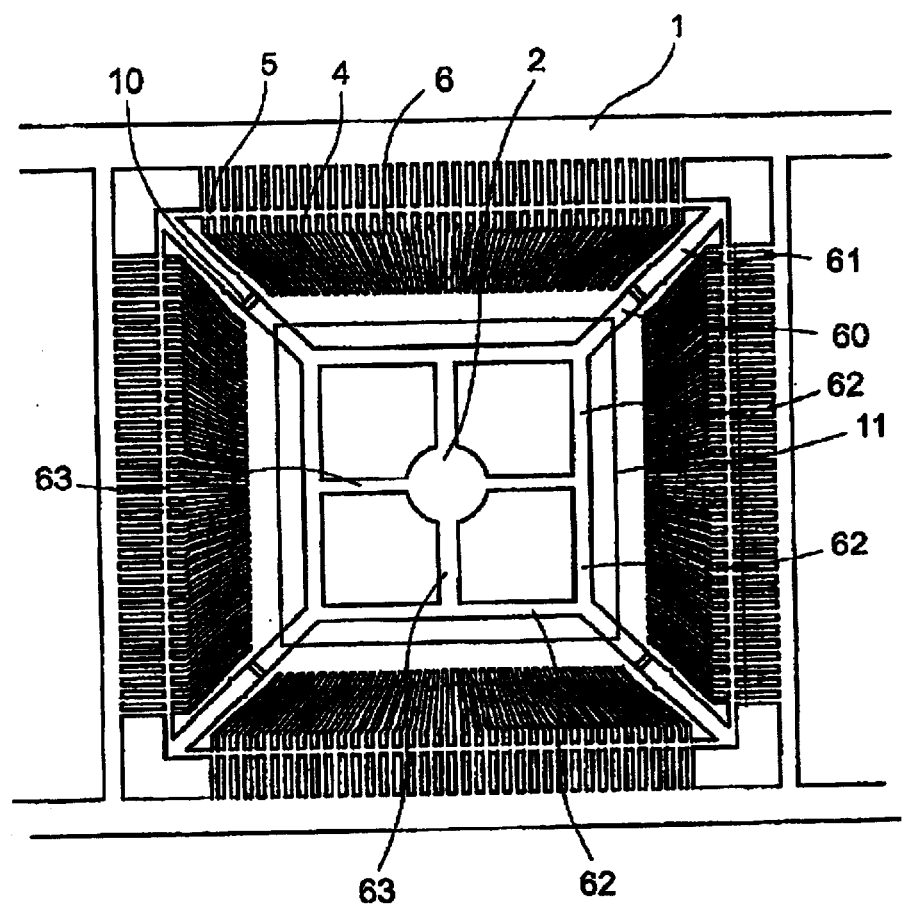
FIG. 6 is a plan view showing a leadframe of a semiconductor package according to second preferred embodiment of the present invention.
Figure 7:
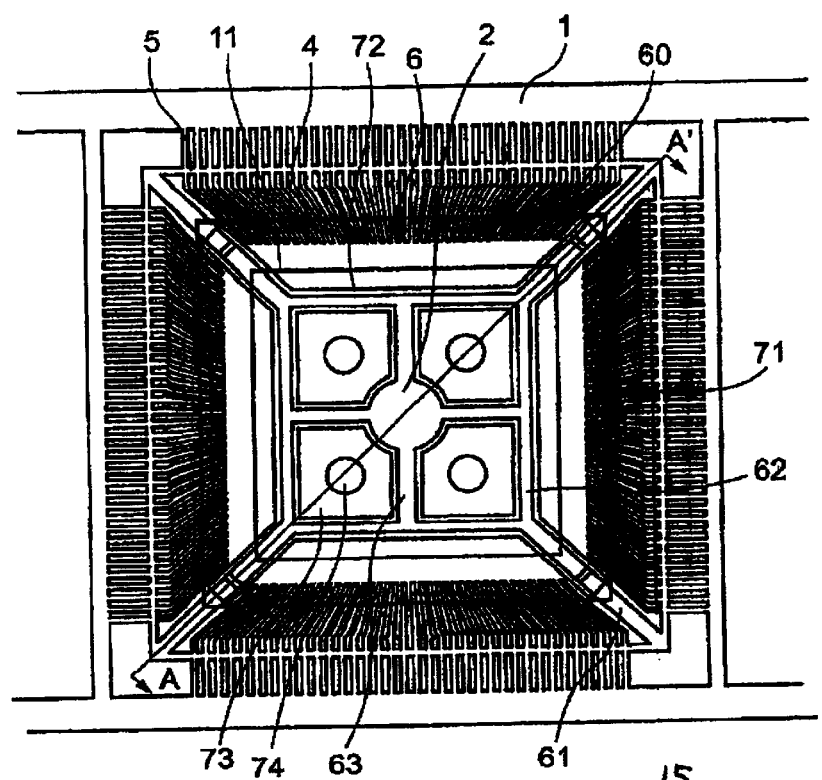
FIG. 7 is a plan view showing a semiconductor package in a wire bonding step according to the second embodiment.

Next, a second preferred embodiment is described referring with FIG. 6 to FIG. 8.

FIG. 6 is a plan view of a leadframe of second embodiment.

FIG. 7 is a plan view of the leadframe which is set on a heat stage.

FIG. 8 is a cross section at a portion of line A–A' in the FIG. 7.

In this embodiment, elements which correspond to the element of the first preferred embodiment are marked with the same symbols to facilitate understanding.

In the second embodiment, a configuration of the die pad supporter is different from the configuration of the die pad supporter disclosed in the first embodiment.

A die pad supporter 60 has first die pad supporter portions 61 each of which is located between the corresponding inner leads 4 and is located parallel with the corresponding inner leads 4, a frame portion 62 which surrounds the die pad 2, and second die pad supporter portions 63 which connect the frame portion 62 to the die pad 2.

A size of the die pad 2 is smaller than a size of the semiconductor chip 11 and a configuration of the die pad 2 is a circular. A configuration of the frame portion 62 is a rectangular and each corner portion of the frame portion 62 is supported by each of the first die pad supporter portion 61 with four different direction each other. The second die pad supporter portions 63 supports each sides of the die pad 2.

A plurality of inner leads 4 are located in the vicinity of the die pad 2 along four sides of the frame portion 62. Each sides of the frame portion 62 are located substantially in parallel with the end of the inner leads 4.

A 42-alloy thin film is pressed for forming the die pad supporter portions 61, the frame portion 62, the die pad supporter portion 63, and the inner leads 4.

After the 42-alloy thin film is pressed, the die pad supporter 60 is subjected to a down setting at an area 10 between the inner leads 4.

Then, the semiconductor chip 11 is mounted on the die pad 2, as shown in FIG. 8.

Electrode pads 15 arranged on a surface of the semiconductor chip are connected to the end of the inner leads 4 through wires 13 in a wire-bonding step.

During the wire-bonding step, the leadframe is clamped on the heat stage 70 by a damper 71. A rear surface of the semiconductor chip 11 is vacuumed by vacuum portions 73 for holding the semiconductor chip 11 on the heat stage, as shown in FIG. 8.

The heat stage 70 has a groove 72 corresponding to the die pad 2 and the down-setting portion of the die pad supporter 60. The depth of the groove 72 is deeper than thickness added a depth of the down setting and a silver paste 12.

The vacuuming portions 73 are located in an area defined by the frame portion 62 and each of adjacent pairs of the second die pad supporter portions 63. A vacuuming hole 74 is formed in the each vacuuming portions 73. The vacuuming hole 74 vacuums the semiconductor chip 11 for holding the semiconductor chip on the heat stage.

Then, an area surrounded by the dam bar 5 is molded with a molding resin. As a result, a distance between a top surface of the semiconductor chip 11 and the a top surface of the molding resin is substantially equal to a distance between the die pad 2 and the rear surface of the molding resin.

In the second embodiment, frame portion 62 is located between the end of the inner leads 4 and the die pad 2. Although the die pad supporter portion 61 expands by thermal expansion in the wire bonding step, the stress is divided to the frame portion 62 and the second die pad supporter portions 63, so as to the die pad 2 is not applied the stress directly. As a result, the changing in the die pad 2 is decreased when the leadframe is disposed on the heat stage 70 in the wire-bonding step.

The first die pad supporter portions 61 each supports the respective corner portions of the frame portion 62, and the each sides of the frame portion 62 support the die pad 2. As a result, the vacuuming hole 74 can be disposed in the substantially square area which is defined by the frame portions 62 and the die pad supporter portion 63. As a result, the diameter of the vacuuming hole 74 can be large. In this case, the vacuuming holes 74 are disposed on the diagonal line of the semiconductor chip 11. Though the semiconductor chip 11 is slightly larger than the die pad 2, the semiconductor chip 11 can be mounted on the vacuuming hole 74 absolutely.

Further, one press mold can be shared for forming a die pad and an inner leads of various type of a semiconductor device. Naturally, ends of the inner leads are cut in accordance with a size of a semiconductor chip of such semiconductor device by a cutting press mold.

Therefore, that enables to fabricate various types of leadframes by combining just one press mold with a suitable cutting press mold. In this case, frame portion 62 are located between the die pad 2 and the end of the inner leads 4. The end of the inner leads 4 is located near the semiconductor chip 11 for shortening a length of the wire. The stress-absorbing portions 7 are located under the semiconductor chip 11.

In the semiconductor device disclosed in the present invention, the die pad supporter has a stress-absorbing portion. The changing of the die pad supporter causing the stress of the die pad supporter by the thermal expansion can be reduced.

The die pad supporter has the frame portion, the die pad supporter portions 61 and the die pad supporter portions 63, so that the stress of the die pad supporter by thermal expansion is absorbed and vacuuming hole for holding the semiconductor chip in the wire bonding step can be large sufficiently.

What is claimed is:

1. A semiconductor device comprising:
   a die pad;
   a die pad supporter which supports the die pad;
   a plurality of inner leads arranged to surround the die pad; and
   a semiconductor chip which has a size larger in area than that of said die pad and which is mounted on said die pad;
   wherein said die pad supporter includes a frame portion which ha a rectangular shape, a first portion connected between a side portion of said frame portion and the die pad, and a second portion which extends from a corner portion of said frame portion to between a pair of said inner leads, and wherein the frame portion and he first portion are disposed between the inner leads and the die pad.

2. A semiconductor device according to claim 1, comprising a plurality of said second portions, wherein each of said second portions is disposed between said inner leads and disposed substantially parallel with said inner leads adjacent to the second portions.

3. A semiconductor device according to claim 2, wherein said second portions extend to four different directions.

4. A semiconductor device according to claim 1, wherein said semiconductor chip has a first surface on which an integrated circuit is formed and a second surface which is opposite said first surface, and wherein said frame portion is arranged adjacent the second surface of the semiconductor chip.

5. A semiconductor device according to claim 1, wherein said second portion of said die pad supporter has a down-set portion which is located at an area between the pair of said inner leads.

6. A semiconductor device comprising:
   a die pad;
   a plurality of inner leads arranged to surround the die pad;
   a semiconductor chip which has a size larger in area than that of said die pad and which is mounted on said die pad;
   a frame portion which substantially surrounds the die pad and is disposed between said inner leads and said die pad;
   first die pad supporters each of which supports the frame portion from four directions; and
   a second die pad supporter which connects the frame portion and said die pad;
   wherein said second die pad supporter is extended along a direction different from directions in which the first die pad supporters are extended.

7. A semiconductor device according to claim 6, wherein said semiconductor chip is disposed on the frame portion.

8. A semiconductor device according to claim 7, wherein said first die pad supporters and said second die pad supporter are staggered at the frame portion.

9. A semiconductor device according to claim 6, wherein said frame portion has substantially rectangular shape, and wherein said first die pad supporters each support substantially coiner portions of said frame portion, and wherein said second die pad supporter connects at a side portion of said frame portion.

10. A semiconductor device according to claim 6, wherein said first die pad supporters have a down-set portion which is located at an area between respective pairs of said inner leads.

* * * * *